United States Patent [19]

Bowers et al.

[11] 4,222,013
[45] Sep. 9, 1980

[54] PHASE LOCKED LOOP FOR DERIVING CLOCK SIGNAL FROM APERIODIC DATA SIGNAL

[76] Inventors: Thomas E. Bowers, 29W602 Butterfield Rd.; Dennis E. Tomlinson, 30W081 Avondale Ct., both of Warrenville, Ill. 60555

[21] Appl. No.: 963,270

[22] Filed: Nov. 24, 1978

[51] Int. Cl.² .............................................. H03B 3/04
[52] U.S. Cl. ................................... 331/1 A; 328/134; 328/155; 331/27
[58] Field of Search ................. 331/1 A, 18, 25, 27; 328/133, 134, 155

[56] References Cited

U.S. PATENT DOCUMENTS

| | | | |
|---|---|---|---|
| 3,544,907 | 12/1970 | Bleickard | 328/63 |
| 3,599,110 | 8/1971 | Gindi | 331/10 |
| 3,714,589 | 1/1973 | Lewis | 328/155 |
| 3,983,498 | 9/1976 | Malek | 328/155 |
| 3,986,125 | 10/1976 | Eibner | 328/155 |
| 4,055,814 | 10/1977 | Abraham et al. | 331/1 A |
| 4,085,288 | 4/1978 | Viswanathan | 331/1 A |

*Primary Examiner*—Siegfried H. Grimm
*Attorney, Agent, or Firm*—Peter Visserman

[57] ABSTRACT

A phase locked loop circuit (100) for generating a periodic clock signal from a controlled oscillator circuit (130) in phase coincidence with a synchronous aperiodic data input signal is disclosed. A pulse of the data signal and a corresponding pulse of the clock signal are applied to a bistable circuit (FF1) having an output signal indicating which of the pulses occurs first in time. The pulses are further applied through delay circuitry (DLY1, DLY2) to another bistable circuit (FF2) having an output signal indicative of the magnitude of phase difference between the pulses. The output signals of the bistable circuits (FF1, FF2) are applied to a multilevel driver circuit (140) which generates an error correction signal pulse defining magnitude and direction of a correction signal to be applied to the oscillator circuit (130).

20 Claims, 3 Drawing Figures

PHASE LOCKED LOOP FOR DERIVING CLOCK SIGNAL FROM APERIODIC DATA SIGNAL

TECHNICAL FIELD

This invention relates to phase synchronization circuits and, more particularly, to digital phase locked loop circuits for deriving a clock signal from a synchronous aperiodic data input signal.

BACKGROUND OF THE INVENTION

In communication systems comprising apparatus for receiving an incoming synchronous serial binary data signal, it is advantageous to generate a periodic clock signal comprising pulses having a fixed phase relationship with pulses of the incoming data signal. To achieve a precise phase relationship, the clock signal may be derived from the data signal by utilization of a phase locked loop circuit. The theory and structure of both analog and digital phase locked loop circuits are well known in the art. Two references describing the general theory of phase locked loop circuits are *Phase-Locked Loops,* Alain Blanchard (John Wiley and Sons, 1976), and *Phaselock Techniques,* Floyd M. Gardner (John Wiley and Sons, 1966).

Several schemes exist within the prior art which utilize digital phase locked loop circuits for deriving a clock signal from an incoming data signal. One prior art disclosure in U.S. Pat. No. 3,714,589, R. Lewis, involving the use of a digital phase locked loop circuit to provide a closed loop system for generating a square-wave output signal shifted in time by a known, but variable amount from an input signal of the same frequency. The square-wave output signal is generated by utilizing a divider circuit and a variable counter circuit to adjust the phase of an output signal of a voltage controlled oscillator. The arrangement is limited to applications having a periodic data input signal, and is not adaptable for phase synchronization with an aperiodic data input signal.

A further prior art arrangement disclosed in U.S. Pat. No. 3,599,110, A. Gindi, utilizes a phase detection circuit comprising a plurality of pulse generators and timing circuitry for generating signals representative of frequency and phase errors between a data input signal and a clock signal. The arrangement provides means for synchronizing the phase and frequency of the clock signal to the data input signal. However, in the absence of a data signal pulse, representative of a binary zero, an error correction signal will be generated which always forces a voltage controlled oscillator to modify the frequency of its output signal in a specific direction. Such modification may force the clock signal to an erroneous frequency, or may cause overcorrection of the clock signal frequency.

U.S. Pat. No. 3,544,907, W. Bleickardt, describes an apparatus for generating timing pulses in synchronism with an incoming data signal. However, the apparatus described in the Bleickardt patent comprises complex signal differentiation and rectification circuitry for generating signals which may be transformed into pulses of equal periodicity through a monostable circuit means. A further limitation of prior art phase locked loop circuits is phase lock instability when the phase error between the clock signal and pulses of the incoming data signal is greater than a certain phase error. For an aperiodic data input signal, the phase lock instability may exist for a substantial period of time.

SUMMARY OF THE INVENTION

Advantageously, in a phase locked loop circuit in accordance with the present invention, the phase of a periodic clock signal is adjusted only in the direction of decreasing magnitude of phase difference between aperiodically occurring data pulses and corresponding clock signal pulses, and phase lock stability over a wide range of phase errors is provided. A novel phase detection circuit applies an error correction pulse to a voltage controlled oscillator through a filter circuit when a data pulse is detected which is not in phase coincidence with a corresponding clock signal pulse. The error pulse, which will indicate both the magnitude and direction of phase error, is generated from a directional signal indicating which of the relevant pulses occurred first in time and an enable signal which enables the error signal generating circuit for a period of time corresponding to the phase difference. Advantageously, in accordance with the present invention, an error correction pulse is generated only when a phase difference is actually detected and the correction is always in the direction of phase coincidence.

The loop circuit arrangement comprises variable frequency clock pulse generator means for generating periodic clock signal pulses on an output terminal and phase detection means connected to the clock pulse generator means and adapted to generate an error correction signal pulse upon occurrence of a phase difference between a pulse of an aperiodic data input signal occurring on an input terminal and a corresponding clock signal pulse. The error correction signal pulse is indicative of the magnitude and direction of the phase difference and the generator means is responsive to the error correction signal pulse for adjusting the phase of the clock signal pulses in the direction of phase coincidence with data input signal pulses.

The phase detection means comprises a first means responsive to the data signal pulse and the corresponding clock signal pulse for generating a directional phase signal indicative of which of the pulses occurs first in time. A second means responsive to the data and clock signal pulses generates a phase correction enable signal indicating the magnitude of the phase difference. Circuit means connected to the first and second means and to the generator means is responsive to the directional phase signal and to the phase correction enable signal for generating the error correction signal pulse.

The second means comprises delay means connected to the input terminal and the generator means and generates delayed data signal and clock signal pulses having a predetermined delay period of a time equivalent to the time required to effect a linear symmetrical relationship between the direction and width of the error correction signal pulse and of the phase difference. Logic circuits connected to the delay means generate combinative logic signals which are applied to a bistable circuit to "SET" the bistable circuit to an enable state substantially coincident in time upon the occurrence of either of the delayed signal pulses. The combinative logic signals are further applied to the bistable circuit to "RESET" the bistable circuit to an inhibit state in the presence of both of the delayed signal pulses. An output signal of the bistable circuit is utilized as the phase correction enable signal.

The generator means comprises filtering means responsive to the error correction signal pulse for applying a low frequency correction signal to an oscillator means. The oscillator means is responsive to the low frequency correction signal for adjusting the phase of subsequently generated clock signal pulses.

A method for achieving advantages of the present invention comprises the steps of generating periodic clock signal pulses from a variable frequency generating means and generating a directional phase signal indicating which of a pulse of an aperiodic data input signal and a pulse of the clock signal occurs first in time. A phase correction enable signal is generated upon occurrence of a phase difference between the pulse of the data signal and the corresponding clock signal pulse and indicates the magnitude of phase difference. An error correction pulse having a width in time substantially equal to the magnitude of phase difference is applied to the generating means and the phase of subsequently generated clock signal pulses is adjusted in response thereto.

BRIEF DESCRIPTION OF THE DRAWING

The invention may be understood from the following detailed description when read with reference to the drawing in which.

DETAILED DESCRIPTION

Figure 1:
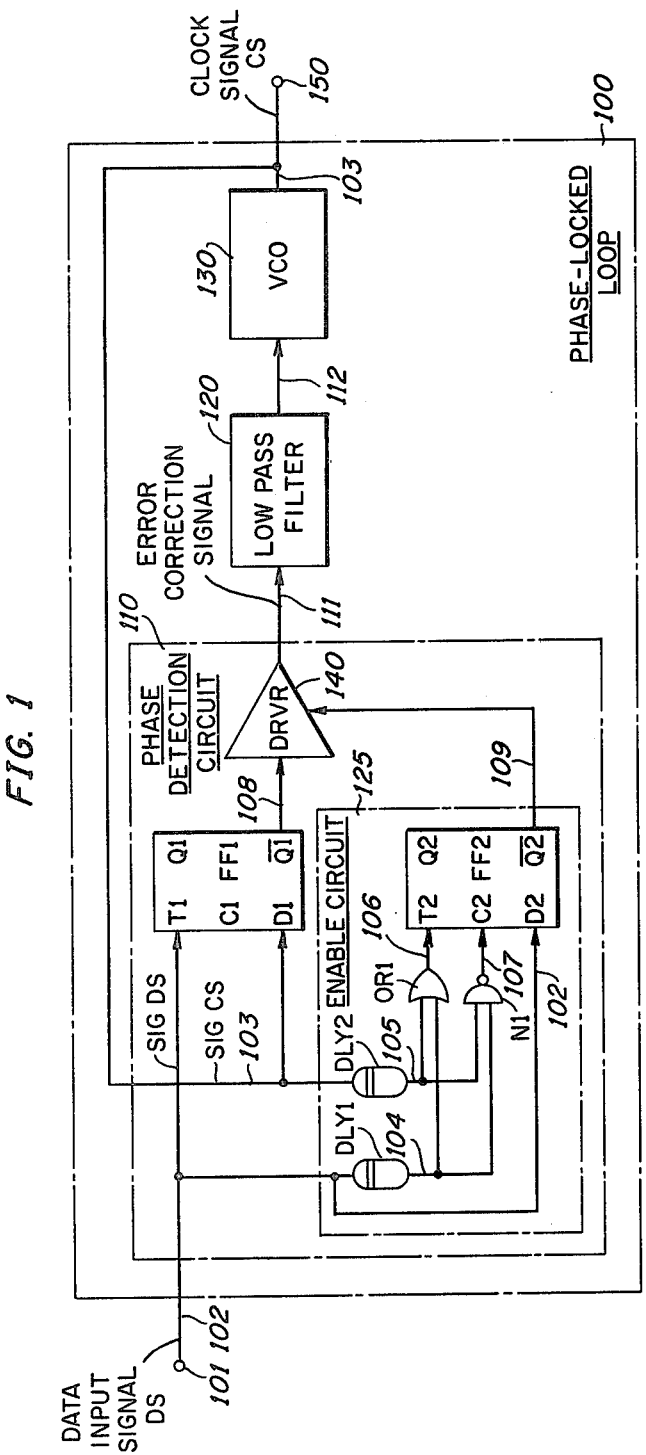
FIG. 1 is a diagram of one illustrative embodiment of a phase locked loop circuit in accordance with the invention.
Figure 2:
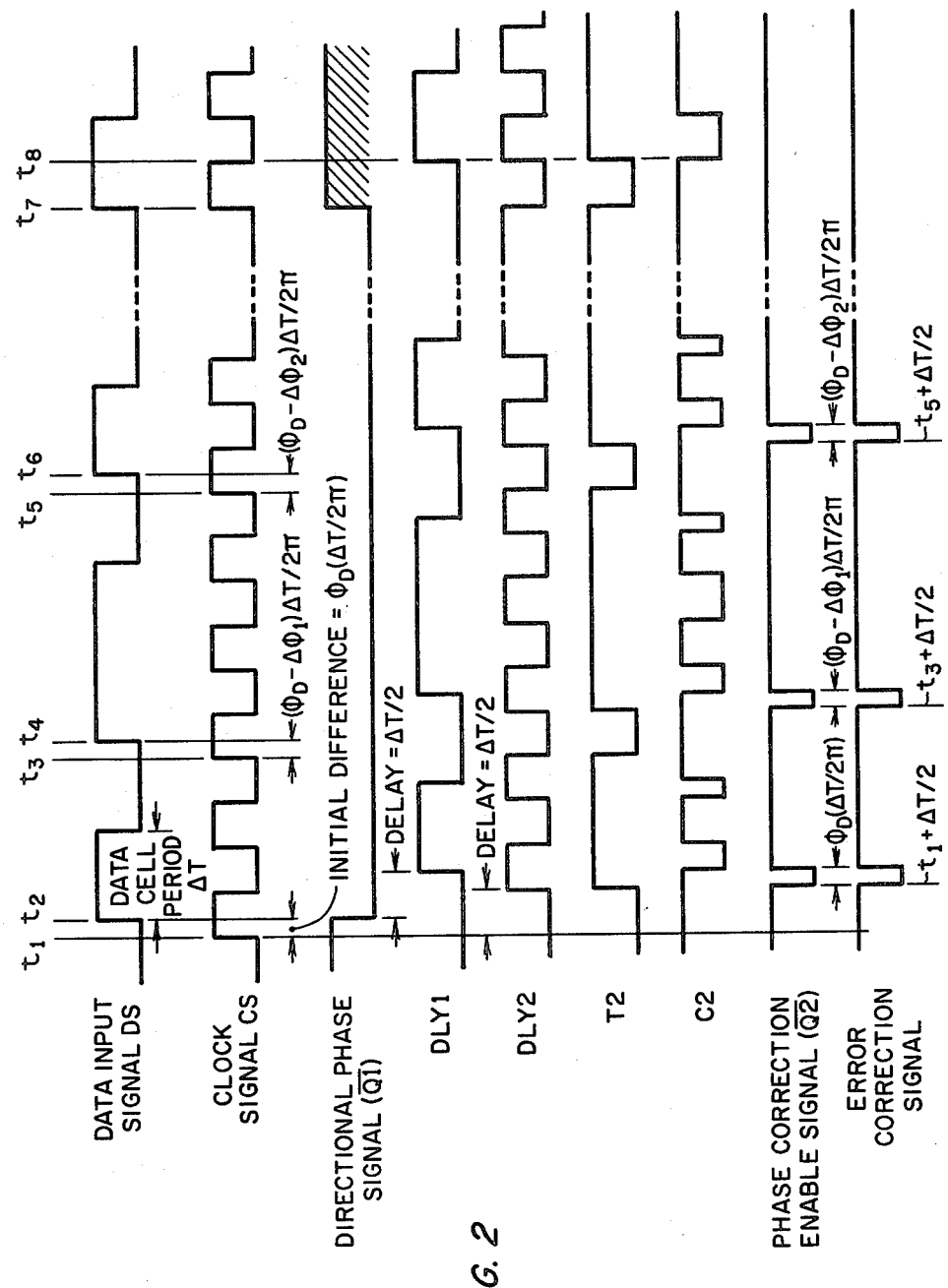
FIGS. 2 and 3 are timing diagrams showing certain of the operations of the circuit of FIG. 1.

One illustrative embodiment of a phase locked loop circuit according to the invention is shown as circuit 100 in FIG. 1. A data input signal DS is received at terminal 101 and applied to loop circuit 100 via conductor 102. For purposes of illustration of the operation of loop circuit 100, data signal DS is assumed to be a synchronous aperiodic serial binary signal comprising a sequence of pulses. Data signal DS is aperiodic in that the sequential pulses do not occur at equal time intervals and are of varying widths. Further, data signal DS is synchronous in that each bit of information is transmitted in a predetermined data cell period wherein all data cells are of equal durations of time. A data cell of data signal DS is defined as having a time period ΔT wherein the presence of a "high" state signal level is indicative of a binary one and the presence of a "low" state signal level is indicative of a binary zero. An exemplary representation of data input signal DS during a period of time comprising the transmission of several bits of information in corresponding data cell periods is shown in FIG. 2. A function of the circuit of the illustrative embodiment of the present invention as shown in FIG. 1 is to provide, at output terminal 150, a periodic clock signal CS which is substantially in phase coincidence with data signal DS, i.e., for each positive transition (a low state to high state transition) of a pulse of data signal DS, there is a time correspondent positive transition of a pulse of periodic clock signal CS. The operation of a phase locked loop circuit in accordance with the invention, however, is not limited to aperiodic incoming data signals. It is only necessary to provide synchronous transmission and the incoming data signal may have either a periodic or an aperiodic characteristic.

As shown in FIG. 1, phase locked loop circuit 100 comprises a phase detection circuit 110, a low pass filter circuit 120, and a variable frequency voltage controlled oscillator circuit (VCO) 130. Data signal DS and clock signal CS are applied to phase detection circuit 110 via conductors 102 and 103, respectively. The function of phase detection circuit 110 is to compare the phase relationship between each pulse of data signal DS and corresponding pulses of clock signal CS. For purposes of description, a pulse of clock signal CS is defined as "corresponding" to one of the pulses of data signal DS when a positive transition of the clock signal pulse occurs within $\pi$ radians in time (with reference to the frequency of clock signal CS) of the pulse of data signal DS. If these pulses are not substantially phase coincident, error correction signal pulses are generated on conductor 111 and applied to low pass filter circuit 120. Filter circuit 120, in a manner well known in the art, is responsive to the error correction pulses to generate low frequency correction signals on conductor 112. The low frequency correction signals are then applied to the controlled oscillator circuit 130 as shown in FIG. 1 and modulate the frequency of the periodic clock signal CS, generated on conductor 103 and applied to output terminal 150, thereby adjusting the phase relationship of pulses of clock signal CS and data signal DS.

Phase detection circuit 110 comprises a bistable circuit FF1, a phase correction enable circuit 125, and a multilevel driver circuit 140 as shown in FIG. 1. Signals DS and CS are applied as input signals to bistable circuit FF1, which generates a directional phase signal on conductor 108 having a signal level indicative of which of a pulse of data signal DS or a corresponding pulse of clock signal CS occurs first in time. The directional phase signal is applied as an input signal to multilevel driver circuit 140. Signals DS and CS are further applied to phase correction enable circuit 125 via conductors 102 and 103, respectively. Phase correction enable circuit 125 generates an enable siggnal on conductor 109 only upon occurrence of a pulse of data signal DS and only when the pulse of data signal DS is not in phase coincidence with a corresponding pulse of clock signal CS. The operation of the various circuit elements of phase correction enable circuit 125 is described in subsequent paragraphs herein. The enable signal on conductor 109 is applied as an input signal to multilevel driver circuit 140 for a period of time substantially equal to the magnitude of phase difference between the data signal pulse and the corresponding clock signal pulse. Accordingly, the multilevel driver circuit 140 is enabled to generate an error correction signal pulse on conductor 111 having a width in time substantially equal to the magnitude of the phase difference and in a direction corresponding to the level of the directional phase signal.

By way of example, FIG. 2 is a timing diagram showing certain of the operations of the phase locked loop circuit 100 when a pulse of clock signal CS occurs prior in time to a pulse of data signal DS. Exemplary representations of data signal DS and clock signal CS during a period of time comprising transmission of several bits of information in corresponding data cell periods is shown in FIG. 2. As previously described, each data cell of data signal DS has a predetermined time period of ΔT. As known in the art, the time period ΔT is an ideal value, and data cell periods may vary within small tolerances during actual reception of an incoming data signal. It is partially due to this variation in data cell periods that a phase locked loop circuit is commonly utilized for deriving a phase coincident clock signal.

Figure 3:
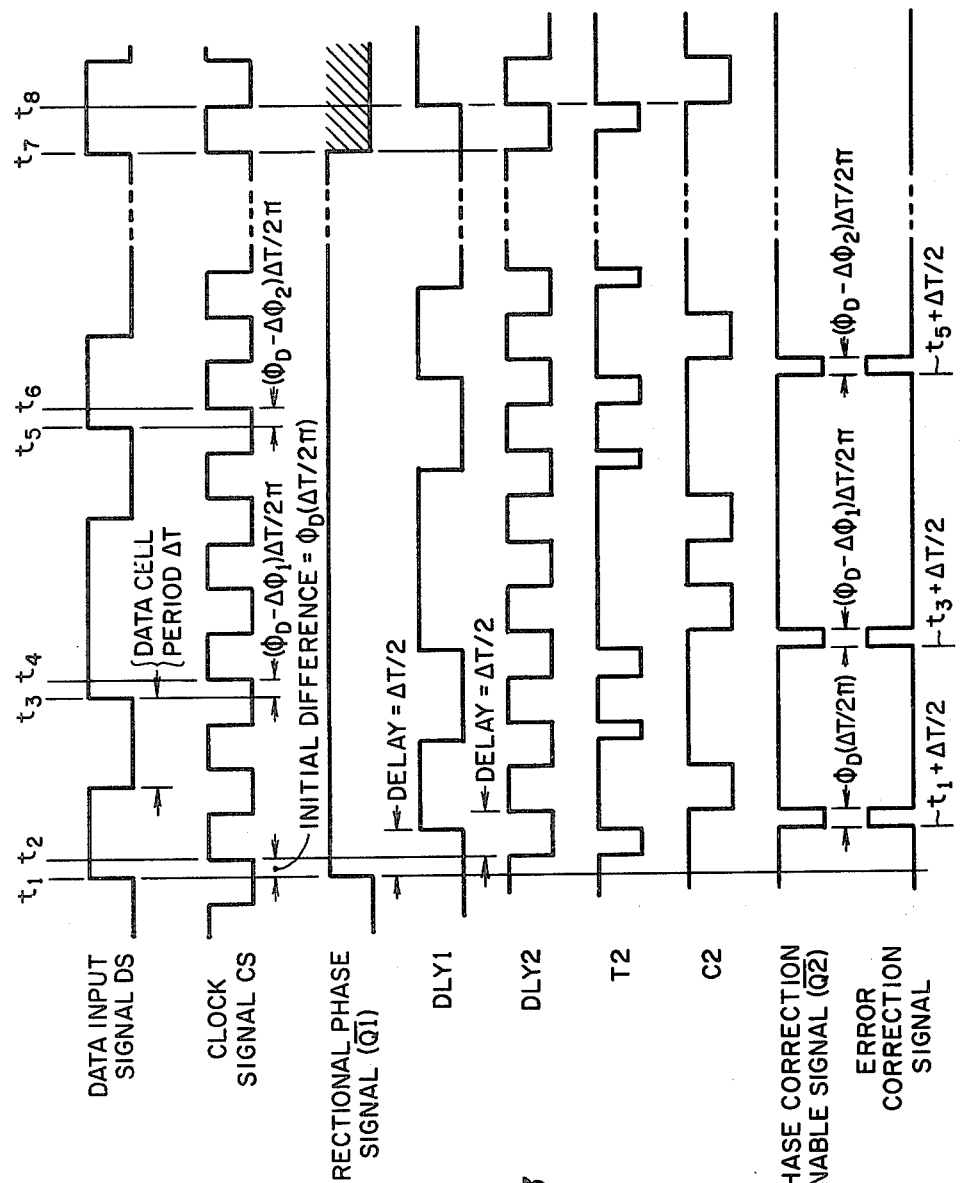

However, for purposes of describing the operation of loop circuit 100 in conjunction with the timing diagrams of FIG. 2 and FIG. 3, it is only necessary to show an initial phase difference between signals DS and CS and each data cell of signal DS is assumed to have the ideal time period of $\Delta T$.

The frequency of generated clock signal CS will vary as a function of the low frequency correction signal applied to voltage controlled oscillator circuit 130 via conductor 112. For the phase locked loop circuit 100 to provide phase coincidence between a pulse of data signal DS and a corresponding pulse of clock signal CS, the voltage controlled oscillator circuit 130 must be capable of generating clock signal CS with a frequency which is substantially equal to, or a multiple of, a "maximum" frequency of data signal DS. Though data signal DS is aperiodic, it is useful for descriptive purposes to define the "maximum" frequency of data signal DS to be the frequency of operation if data signal DS were to comprise alternating binary ones and zeroes. Noting that each data cell has a time period of $\Delta T$, the maximum frequency of data signal DS is $\frac{1}{2}\Delta T$. Accordingly, voltage controlled oscillator circuit 130 must be capable of generating clock signal CS with a frequency of $\frac{1}{2}\Delta T$ or a multiple thereof.

As illustrated by the representations of signals DS and CS in the timing diagrams of FIG. 2 and FIG. 3, voltage controlled oscillator circuit 130 as shown in FIG. 1 is capable of generating clock signal CS with a frequency twice that of the maximum frequency of data signal DS, i.e., a frequency of $1/\Delta T$. For purposes of description, the frequency of $1/\Delta T$ is defined as the "expected" frequency of clock CS, and is the frequency of operation when signal CS is in phase coincidence with data signal DS. Accordingly, the "expected" clock signal period is defined as $\Delta T$, i.e., the inverse of the expected clock signal frequency. As known in the art of communication systems design utilizing phase locked loop circuits, it is often advantageous to generate a clock signal having an expected frequency substantially equal to twice that of the maximum frequency of an incoming data signal. Such frequency characteristics effect negative transitions (high state to low state) of clock signal pulses substantially at the midpoint in time of data cells of the incoming data signal. A typical register circuit strobing arrangement may provide for strobing of individual bit information from the incoming data signal into corresponding bit cells of a register circuit during each occurrence of a negative transition of a clock signal pulse, thereby allowing maximum tolerances to prevent the "missing" of data signal bit information. Therefore, the representations of signals DS and CS as shown in the timing diagrams of FIG. 2 and FIG. 3 is in full accordance with general phase locked loop circuit design criteria.

For purposes of description, a pulse will be defined as "occurring" at a time corresponding to the time of occurrence of the leading edge of the pulse. Except for the error correction signal on conductor 111 as shown in FIG. 1 and described in subsequent paragraphs herein, a leading edge of a pulse will always correspond to a positive, or low to high state transition. Accordingly, as shown in FIG. 2, a pulse of clock signal CS occurs at time $t_1$ and a pulse of data signal DS occurs at a later time $t_2$. As previously defined, the clock signal pulse at time $t_1$ is a corresponding pulse to the data signal pulse at time $t_2$. The initial time difference $t_2 - t_1$ between these pulses is shown in FIG. 2 as $\phi_D(\Delta T/2\pi)$ where $\phi_D$ is defined as the phase difference in radians relative to the expected clock signal frequency. For purposes of describing the operation of phase locked loop circuit 100 in conjunction with the timing diagrams of FIGS. 2 and 3, propagation delays associated with the circuit elements shown in FIG. 1, other than those of delay circuits DLY1 and DLY2, will be substantially ignored since commercially available elements having inconsequential propagation delays at standard clock signal frequencies (such as 16.384 MHz) may be utilized. Accordingly, unless otherwise specified, the times of occurrences of pulses shown in FIG. 2 do not take into account the minimal propagation delays of circuit elements of loop circuit 100.

As shown in FIG. 1, data signal DS and clock signal CS are applied to phase detection circuit 110 via conductors 102 and 103, respectively. Phase detection circuit 110 is utilized to generate an error correction signal pulse on conductor 111 when a phase difference occurs between a pulse of data signal DS and a corresponding pulse of clock signal CS. As described later herein, the error correction signal pulse indicates both the magnitude and the direction of phase difference. The direction of phase difference is defined as the direction of minimum phase adjustment of clock signal CS necessary to lock signal CS in phase coincidence with data signal DS. For purposes of subsequent discussion, a phase difference having a negative direction is defined as a phase difference wherein a pulse of data signal DS occurs subsequent in time to a corresponding pulse of clock signal CS. Additionally, a phase difference having a positive direction is defined as a phase difference wherein a pulse of data signal DS occurs prior in time to a corresponding pulse of clock signal CS. As shown in FIG. 2, the phase difference between the pulse of data signal DS occurring at time $t_2$ and the corresponding pulse of clock signal CS occurring at time $t_1$ is a phase difference having a negative direction and a magnitude $\phi_D$ equal to $(t_2 - t_1)(2\pi/\Delta T)$.

Pulses of both data signal DS and clock signal CS are further applied to bistable circuit FF1 within phase detection circuit 110. As shown in FIG. 1, bistable circuit FF1 comprises a commercially available "D" type flip-flop having a "D" input terminal (D1), a trigger input terminal (T1), an asynchronous "CLEAR" input terminal (C1), and two output terminals (Q1 and $\overline{Q1}$), each of which is the complement of the other. For purpose of description of the operation of flip-flop FF1, and for subsequent description of the operation of other circuit elements of the illustrative embodiment of the present invention shown in FIG. 1, a signal representative of a binary one will be termed as "high" signal and a signal representative of a binary zero will be termed a "low" signal. Though neither the C1 input terminal nor the Q1 output terminal is utilized with bistable circuit FF1, it is noted that a low signal applied to the C1 terminal would unconditionally cause the signal at the Q1 output terminal to be in a low state and, accordingly, the signal at the $\overline{Q1}$ output terminal to be in a high state. A positive transition of a pulse at the T1 input terminal will cause the signal appearing at the D1 input terminal to be gated to the Q1 output terminal. By example, if the D1 input terminal has a signal in the high state, a positive transition of a pulse occuring at the T1 input terminal will cause a high state signal to appear at the Q1 output terminal and, accordingly, a low state signal to appear at the $\overline{Q1}$ output terminal. Negative transitions of pulses at the T1 input terminal will have no effect on the signals appearing at the Q1 and $\overline{Q1}$ output terminals. When bistable circuit FF1 has a low signal appearing at its $\overline{Q1}$ output terminal, it is said to be in a "SET" state. Similarly, when a high signal appears at its $\overline{Q1}$ output terminal, it is said to be in a "RESET" state.

The pulse of data signal DS occurring at time $t_2$ is applied to the trigger input terminal T1 of bistable circuit FF1 via conductor 102 as shown in FIG. 1. The corresponding pulse of clock signal CS occurring at time $t_1$ is applied to the D1 input terminal of flip-flop FF1 via conductor 103. As shown in FIG. 2, clock signal CS is in a high state at time $t_2$. Accordingly, the positive transition of the pulse of data signal DS at time $t_2$ causes a low state signal to appear at time $t_2$ on conductor 108 connected to the $\overline{Q1}$ output terminal of flip-flop FF1 as shown in FIG. 1. This signal is defined as the directional phase signal and is shown in FIG. 2. The low state directional phase signal on conductor 108 indicates that pulses of data signal DS are presently occurring subsequent in time to corresponding pulses of clock signal CS. Therefore, as previously defined, the phase difference is presently in a negative direction.

Pulses of data signal DS and clock signal CS are further applied to phase correction enable circuit 125 via conductors 102 and 103 as shown in FIG. 1. Specifically, within phase correction enable circuit 125, the pulses of data signal DS and clock signal CS are applied to delay circuits DLY1 and DLY2, respectively. Delay circuits DLY1 and DLY2 are identical and may comprise any commercially available delay circuits. The predetermined delay period of each of circuits DLY1 and DLY2 is substantially equal to $\Delta T/2$, where $\Delta T$ has been previously defined as the expected period of clock signal CS. As described later herein, the utilization of predetermined delay periods substantially equal to one-half of the expected clock signal period provides for a symmetrical functional relationship of the magnitude of phase difference between pulses of data signal DS and corresponding pulses of clock signal CS and the energy content of error correction signal pulses.

The output signal of delay circuit DLY1 on conductor 104 is shown as DLY1 in FIG. 2 and comprises a delayed data signal pulse having a positive transition at time $t_2 + \Delta Y/2$. Similarly, the output signal of delay circuit DLY2 on conductor 105 is shown as DLY2 in FIG. 2 and comprises a delayed clock signal pulse having a positive transition at time $t_1 + \Delta T/2$. Both the delayed data signal and the delayed clock signal are applied as input signals to logic circuits OR1 and N1 as shown in FIG. 2. Logic circuits OR1 and N1 comprise functional "OR" and "NAND" circuits, respectively. The logic circuit combinative output signals of circuits OR1 and N1 are both applied to bistable circuit FF2 as shown in FIG. 1. Circuits OR1 and N1, when operating in conjunction with bistable circuit FF2, are of a design such that the propagation delays of signals applied at the respective inputs of the logic circuits are substantially equal with reference to the occurrence of a resultant output signal of circuit FF2. Bistable circuit FF2 comprises a commercially available "D" type flip-flop substantially identical in structure to that described with respect to bistable circuit FF1. Accordingly, terminals T2, C2, D2, Q2, and $\overline{Q2}$ of circuit FF2 as shown in FIG. 1 correspond in function to terminals T1, C1, D1, Q1, and $\overline{Q1}$, respectively, of circuit FF1 as previously described. The output signal of logic circuit OR1 is a logical "OR" combinative signal of the output signals of delay circuits DLY1 and DLY2 and is applied to the T2 input terminal of circuit FF2 as shown in FIG. 1. This combinative signal is shown as T2 in FIG. 2 and comprises a low state to high state transition at time $t_1 + \Delta T/2$. The output signal of logic circuit N1 is a logical inverse "AND" (known in the art as a "NAND" combinative signal of the output signals of delay circuits DLY1 and DLY2 and is applied to the C2 input terminal of circuit FF2. This combinative signal is shown as C2 in FIG. 2 and comprises a high state to low state transition at time $t_1 + \Delta T/2 + \phi_D (\Delta T/2\pi)$. Data signal DS is also applied to bistable circuit FF2 as shown in FIG. 1 via conductor 102 and input terminal D2.

The low state to high state transition of the previously described signal applied to terminal T2 of bistable circuit FF2 at time $t_1 + \Delta T/2$ will cause the signal appearing at the D2 input terminal, i.e., data signal DS, to be gated to the Q2 output terminal. Accordingly, the inverse of the signal at the D2 terminal will be gated to the $\overline{Q2}$ output terminal. The signal appearing at the $\overline{Q2}$ output terminal is designated the phase correction enable signal and is shown in FIG. 2. Since data signal DS is in a high state at time $t_1 + \Delta T/2$ as shown in FIG. 2, the phase correction enable signal appearing at the $\overline{Q2}$ output terminal and on conductor 109 has a high state to low state transition at time $t_1 + \Delta T/2$ (disregarding the propagation delays of bistable circuit FF2). This transition corresponds to bistable circuit FF2 going to a SET state (the SET and RESET states were previously described with respect to bistable circuit FF1). The signal applied to the C2 input terminal goes from a high state to a low state at time $t_1 + \Delta T/2 + \phi_D (\Delta T/2\pi)$. This transition asynchronously causes bistable circuit FF2 to go to a RESET state and, accordingly, the phase correction enable signal at the $\overline{Q2}$ output terminal returns to a high state as shown in FIG. 2. Therefore, the phase correction enable signal at the $\overline{Q2}$ output terminal and on conductor 109 goes to a low state at time $t_1 + \Delta T/2$ and remains in this state for a period of time corresponding to the initial magnitude of phase difference between the data signal pulse and the corresponding clock signal pulse.

The phase correction enable signal on conductor 109 and the previously described directional phase signal on conductor 108 are applied as input signals to multilevel driver circuit 140 as shown in FIG. 1. Multilevel driver circuit 140, in a manner well known in the pertinent art, generates an output signal having one of three levels on conductor 111 in response to the levels of input signals applied thereto. The output signal on conductor 111 is defined as the error correction signal as shown in FIG. 1 and FIG. 2. When the phase correction enable signal on conductor 109 is in a high state, driver circuit 140 is unconditionally in an "inhibit" state whereby the error correction signal on conductor 140 is defined as being in a "high impedance" state. With the error correction signal on conductor 111 in the high impedance state, no energy is applied to low pass filter circuit 120. When the phase correction enable signal on conductor 109 is in a low state, multilevel driver circuit 140 is said to be "enabled" and the level of its corresponding output signal, i.e., the error correction signal on conductor 111, is dependent on the level of the directional phase signal on conductor 108. When enabled, driver circuit 140 generates an error correction signal on conductor 111 having a negative level, in relationship to the high impedance state level previously described, when the directional phase signal on conductor 108 is in a low state. Similarly, driver circuit 140 generates an error correction signal on conductor 111 having a positive level, in relationship to the high impedance state level, when the directional phase signal on conductor 108 is in a high state. A pulse of the error correction signal on conductor 111 having a positive level is defined as a positive error correction pulse and, similarly, a pulse having a negative level is defined as a negative error correction pulse. The magnitude of the positive correction pulses is substantially equal to that of the negative error correction pulses.

As previously described and shown in FIG. 2, the phase correction enable signal on conductor 109 goes to a low state at time $t_1+\Delta T/2$ and remains in that state for a period of time corresponding to the initial magnitude of phase difference $\phi_D$ (the actual time period being $\phi_D(\Delta T/2\pi)$). During the period of time from $t_1+\Delta T/2$ to $t_1+\Delta T/2°\phi_D(\Delta T/2\pi)$, the directional phase signal on conductor 108 is in a low state. Accordingly, multilevel driver circuit 140 is enabled at time $t_1+\Delta T/2$ and the error correction signal on conductor 111 then goes to a negative level as shown in FIG. 2. Driver circuit 140 goes to the inhibit state at time $t_1+\Delta T/2+\phi_D(\Delta T/2\pi)$ in response to the phase correction enable signal returning to a high state at that time. Therefore, the error correction signal on conductor 111 comprises a negative error correction pulse occurring at time $t_1+\Delta T/2$ and having a width in time corresponding to the initial phase difference $\phi_D$.

The delay circuits DLY1 and DLY2 previously described with respect to FIG. 1 each have a delay period of time $\Delta T/2$ corresponding to one-half of the expected period of clock signal CS. The utilization of this delay period results in a linear symmetrical phase detection transfer curve. As well known in the art of phase locked loop circuit design, the phase detection transfer curve is a two-dimension plot of the energy applied to low pass filter circuit 120 via error correction signal pulses versus the phase difference between pulses of data signal DS and corresponding pulses of clock signal CS. A negative error correction pulse on conductor 111 results in a removal of energy from low pass filter circuit 120, and is defined as a negative energy application. Defining the energy applied by one specific error correction pulse to filter circuit 120 as $e_a$ (the specific dimension can be ignored), and the phase difference in radians as $\phi$, the phase detection transfer curve is linear and symmetrical in that:

$$e_a = (C/\pi)\phi \text{ for } -\pi < \phi < \pi$$

where C is defined as the applied energy when $\phi$ is equal to $\pi$ radians. Since the magnitudes of all error correction pulses are substantially equal, a similar equation to the one shown above may be written with the width of the error correction pulse substituted for the variable $e_a$ (the width of a negative correction pulse is defined as having a negative value). Therefore, with the delay periods of circuits DLY1 and DLY2 being substantially equal to $\Delta T/2$, a linear symmetrical relationship exists between the direction and width in time of resultant error correction signal pulses and of the causative phase differences between data signal pulses and corresponding clock signal pulses. Advantageously, with a linear symmetrical phase detection transfer curve as described above, phase lock loop circuit 100 provides the maximum amount of phase correction without causing the "slipping" or "gaining" of a clock signal cycle.

The negative error correction pulse occurring at time $t_1+\Delta T/2$ as shown in FIG. 2 is applied to low pass filter circuit 120 via conductor 111 as shown in FIG. 1. Circuit 120 generates a low frequency correction signal on conductor 112 in response to the negative error correction pulse applied thereto. As known in the art, leakage exists in all physically realized filter circuits. However, filter circuits with inconsequential leakage are commercially available and for purposes of describing the operation of loop circuit 100 in accordance with the invention, the leakage of circuit 120 may be ignored. Accordingly, the level of the low frequency correction signal generated by filter circuit 120 at any given time is a composite signal of all prior error correction pulses. The application of a positive error correction pulse to filter circuit 120 supplies energy to the circuit, thereby increasing the level of the low frequency correction signal. Similarly, the application of a negative error correction pulse (previously described as a negative energy application) removes energy from filter circuit 120, thereby decreasing the level of the low frequency correction signal. The magnitude of the change in level, and the time required to reach the resultant decreased level are dependent on the particular parameters of the circuit elements utilized in loop circuit 100. However, in accordance with the invention, the energy content of the low frequency correction signal will always be proportional to the integral in time of the previously occurring error correction pulses.

Since the error correction pulse occurring at time $t_1+\Delta T/2$ is a negative correction pulse as shown in FIG. 2, energy is accordingly removed from low pass filter circuit 120 and the low frequency correction signal on conductor 112 decreases in signal level. As previously described, the low frequency correction signal is applied as an input signal to voltage controlled oscillator circuit 130 and modulates the frequency of the generated periodic clock signal CS applied to output terminal 150 via conductor 103 as shown in FIG. 1. As known in the art, a voltage controlled oscillator circuit 130 as shown in FIG. 1 requires a bias current applied thereto via conductor 112. A commercially available voltage controlled oscillator may be utilized for circuit 130 such that the required bias current is inconsequential and may be ignored for purposes of further discussion of the operation of the illustrative embodiment shown in FIG. 1 in accordance with the invention. Voltage controlled oscillator circuit 130 is a commercially available circuit and the magnitude of frequency of its output signal, i.e., clock signal CS, as a function of the signal level of the low frequency correction signal on conductor 112 is dependent on the particular oscillator circuit utilized. However, defining the low frequency correction signal level on conductor 112 as having a range of 0 to $+V$ volts, it is advantageous to generate clock signal CS at the expected clock signal frequency when the low frequency correction signal level is approximately equal to $+V/2$ volts. As known in the art, this specific functional relationship provides equal ranges of frequency correction above and below the expected clock signal frequency and further provides normal operation at a midpoint between the possible extreme values of the low frequency correction signal level.

The decrease of the level of the low frequency correction signal on conductor 112 due to the negative correction pulse on conductor 111 at time $t_1+\Delta T/2$ results in a small decrease of the frequency of clock signal CS on conductor 103. As shown in FIG. 2, the result of this decrease in clock signal frequency is a phase difference between the next pulse of data signal DS occurring at time $t_4$ and a corresponding pulse of clock signal CS occurring at time $t_3$ which is less than the initial phase difference $\phi_D$. This phase difference is shown in FIG. 2 as $\phi_D - \Delta\phi_1$ and is equal to $(t_4-t_3)(2\pi/\Delta T)$. The quantity $\Delta\phi_1$ is the change in phase difference resulting from the negative correction pulse of the error correction signal occurring at time $t_1+\Delta T/2$. The actual magnitude of $\Delta\phi_1$ is determined by the specific parameters of the circuit elements utilized in phase locked loop circuit 100. As a result of the phase difference $\phi_D-\Delta\phi_1$ between the data signal pulse and the corresponding clock signal pulse occurring at times $t_4$ and $t_3$, respectively, a negative correction pulse of the error correction signal occurs at time $t_3+\Delta T/2$ having a pulse width substantially equal in time to $(\phi_D-\phi_1)(\Delta T/2\pi)$ as shown in FIG. 2. The operation of phase locked loop circuit 100 resulting in the generation of this negative correction pulse is similar to the circuit operation described with respect to generation of the negative correction pulse occurring at time $t_1+\Delta T/2$.

The negative correction pulse occurring at time $t_3+\Delta T/2$ is applied to low pass filter circuit 120 as shown in FIG. 1 and further decreases the level of the low frequency correction signal on conductor 112, thereby further decreasing the frequency of clock signal CS as generated by voltage controlled oscillator circuit 130. As shown in FIG. 2, the next pulse of data signal DS occurs at time $t_6$ and a corresponding pulse of clock signal CS occurs at a prior time $t_5$. The phase difference between these pulses is shown as $\phi_D-\Delta\phi_2$ and is equal to $(t_6-t_5)(2\pi/\Delta T)$. The quantity $\Delta\phi_2$ is greater in value than $\Delta\phi_1$ and is the change in phase difference (with respect to initial phase difference $\Delta\phi_D$) resulting from the two negative correction pulses occurring at times $t_1+\Delta T/2$ and $t_3+\Delta T/2$. The phase difference $\phi_D-\Delta\phi_2$ produces a further negative correction pulse of the error correction signal occurring at time $t_5+\Delta T/2$ as shown in FIG. 2.

Each subsequent pulse of the data signal DS will result in a further modification of the frequency of clock signal CS, thereby continuously adjusting the phase relationship between signals DS and CS. The phase differences between the subsequent pulses of data signal DS and corresponding pulses of clock signal CS will decrease until clock signal CS is in phase coincidence with data signal DS. The time required for adjustment into phase coincidence is dependent on the density of pulses of data signal DS and circuit element parameters utilized in phase locked loop circuit 100. The dotted lines shown in FIG. 2 indicate that several pulses of data signal DS may occur between times $t_6$ and $t_7$. The pulses of data signal DS and clock signal CS shown as occurring each at time $t_7$ illustrate the operation of loop circuit 100 when phase coincidence is established. The signal $\overline{Q1}$ output terminal, i.e., the directional phase signal, is of an unknown level subsequent to time $t_7$ since a positive transition of either the data signal pulse or the clock signal pulse is actually occurring first in time. However, as shown in FIG. 2, the level of the directional phase signal is of no consequence since the trigger signal of bistable circuit FF2 at the T2 input terminal occurs at a time $t_8$ which substantially corresponds to the time of the low state signal level at the C2 input terminal. Therefore, a low state phase correction enable signal will not be generated for any consequential period of time. Accordingly, no pulse of the error correction signal will be applied to low pass filter circuit 120 and the level of the low frequency correction signal on conductor 112 remains constant.

FIG. 3 illustrates the operation, in accordance with the invention, of phase locked loop circuit 100 when a pulse of data signal DS occurs at a time $t_1$ prior to the occurrence of a corresponding pulse of clock signal CS at time $t_2$. The initial time difference $t_2-t_1$ between these pulses is shown in FIG. 3 as $\phi_D(\Delta T/2\pi)$ where $\phi_D$ has an identical meaning with that previously defined with respect to FIG. 2. The basic operations illustrated by the timing diagram of FIG. 3 are the same as previously described with respect to FIG. 2. However, with the data signal DS "leading" clock signal CS as shown in FIG. 3, the directional phase signal at the $\overline{Q1}$ output terminal goes to a high state at time $t_1$ and a positive error correction pulse of the error correction signal occurs at time $t_1+\Delta T/2$. The positive error correction pulse, having a width in time corresponding to initial phase difference $\phi_D$, applies energy to low filter circuit 120, thereby increasing the level of the low frequency correction signal on conductor 112. Accordingly, the frequency of the clock signal CS generated by controlled oscillator circuit 130 is increased. As shown in FIG. 3, the next pulse of data signal DS occurs at time $t_3$ and a corresponding pulse of clock signal CS occurs at time $t_4$. The phase difference between these pulses is defined as $\phi_D-\phi_1$ where $\Delta\phi_1$ is the change in phase difference between signals DS and CS resulting from the positive error correction pulse occurring at time $t_1+\Delta T/2$. As a result of the phase difference $\Delta\phi_D-\Delta\phi_1$, phase detection circuit 110 generates a positive correction pulse of the error correction signal on conductor 111 at a time $t_3+\Delta T/2$ as shown in FIG. 3. The width in time of this positive correction pulse is substantially equal to $(\Delta\phi_D-\Delta\phi_1)(\Delta T/2\pi)$, and applies further energy to low pass filter circuit 120, thereby further increasing the level of the low frequency correction signal on conductor 112. As shown in FIG. 3, the phase difference between the next pulse of data signal DS occurring at time $t_5$ and a corresponding pulse of clock signal CS occurring at time $t_6$ is defined as $\Delta_D-\Delta\phi_2$. $\Delta\phi_2$ is greater in value than $\Delta\phi_1$ and is the change in phase difference resulting from the two prior positive correction pulses. The result of phase difference $\Delta\phi_D-\Delta\phi_2$ is the generation of the positive correction pulse occurring at time $t_5+\Delta T/2$.

As previously described with respect to FIG. 2, with each subsequent pulse of data signal DS, phase locked loop circuit 100 provides further adjustment of the frequency of clock signal CS until phase coincidence occurs between signals DS and CS. FIG. 3 illustrates the operation of phase locked loop circuit 100 when phase coincidence is achieved at a time $t_7$ corresponding to the occurrence of both a pulse of data signal DS and a pulse of clock signal CS. This operation has been previously described herein with respect to FIG. 2.

In accordance with the invention, other circuit elements may be utilized than those of phase locked loop circuit 100 as depicted in FIG. 1. Various elements, such as frequency multiplier and divider circuits, may be incorporated into a phase locked loop circuit operating in accordance with the principles of the invention. It is to be understood that the above-described arrangement is merely an illustrative application of the principles of the invention; numerous other arrangements may be devised by those skilled in the art without departing from the spirit and scope of the invention.

What is claimed is:

1. A phase locked loop circuit (100) having an input terminal (101) and an output terminal (150) and adapted to generate periodic clock output signal pulses in phase coincidence with a synchronous data input signal occurring on said input terminal (101) and comprising aperiodically occurring data signal pulses, wherein said phase locked loop circuit (100) comprises:

variable frequency clock pulse generator means (120, 130) for generating said periodic clock signal pulses on said output terminal (150); and phase detection means (110) connected to said clock pulse generator means (120, 130) and to said input terminal (101) and responsive to said data signal pulses and to said clock signal pulses for generating error correction signal pulses;

characterized in that said phase detection means (110) is adapted to generate an error correction signal pulse upon occurrence of a phase difference between one of said data signal pulses and a corresponding one of said clock signal pulses and wherein said error correction signal pulse is indicative of the magnitude and direction of said phase difference; and said generating means (120, 130) is responsive to said error correction signal pulse for adjusting the phase of said clock signal pulses in the direction of phase coincidence, whereby the adjustment continuously decreases the magnitude of said phase difference.

2. A phase locked loop circuit (100) in accordance with claim 1 characterized in that said phase detection means (100) comprises:

first means (FF1) having first and second stable states and connected to said input terminal (101) and to said generating means (120, 130) and responsive to said one data signal pulse and to said corresponding clock signal pulse for generating a directional phase signal indicative of which of said signal pulses occurs first in time;

second means (125) connected to said input terminal (101) and to said generating means (120, 130) and responsive to said one data signal pulse and to said corresponding clock signal pulse for generating a phase correction enable signal indicative of the magnitude of said phase difference; and circuit means (140) connected to said first means (FF1), said second means (125), and said generating means (120, 130), and responsive to said directional phase signal and to said phase correction enable signal for generating said error correction signal pulse.

3. A phase locked loop circuit (100) in accordance with claim 2 characterized in that said first means (FF1) assumes said first stable state when said one data signal pulse occurs prior in time to said corresponding clock signal pulse and said first means (FF1) assumes said second stable state when said corresponding clock signal pulse occurs prior in time to said one data signal pulse.

4. A phase locked loop circuit (100) in accordance with claim 2 characterized in that said generating means (120, 130) is connected to said circuit means (140) and comprises filtering means (120) and oscillator means (130) wherein said filtering means (120) is responsive to said error correction signal pulses for applying low frequency correction signals to said oscillator means indicative of the magnitude and direction of said phase difference; and said oscillator means (130) is responsive to said low frequency correction signals for adjusting the phase of said clock signal pulses in the direction of phase coincidence, whereby the adjustment continuously decreases the magnitude of said phase difference.

5. A phase locked loop circuit (100) in accordance with claim 2 characterized in that said circuit means (140) is adapted to selectively generate a high impedance correction signal when said one data signal pulse is substantially in phase coincidence with said corresponding clock signal pulse and wherein the direction and width in time of said error correction signal pulse is a substantially linear symmetrical function of said phase difference when the value of said phase difference is greater than minus $\pi$ radians and less than $\pi$ radians with reference to said periodic clock output signal pulses.

6. A phase locked loop circuit (100) in accordance with claim 2 characterized in that said second means (125) comprises:

delay means (DLY1, DLY2) connected to said input terminal (101) and to said generating means (120, 130) and responsive to said one data signal pulse and to said corresponding clock signal pulse for generating a delayed data signal pulse and a delayed clock signal pulse, respectively;

logic means (OR1, N1) connected to said delay means (DLY1, DLY2) and responsive to said delayed data signal pulse and to said delayed clock signal pulse for generating a plurality of combinative logic signals; and a bistable circuit (FF2) having a "SET" state and a "RESET" state and connected to said logic means (OR1, N1) and to said circuit means (140) and responsive to said plurality of combinative logic signals for generating said phase correction enable signal.

7. A phase locked loop circuit (100) in accordance with claim 6 characterized in that said logic means (OR1, N1) comprises an "OR" gate (OR1) connected to said delay means (DLY1, DLY2) and to said bistable circuit (FF2) and responsive to said delayed data signal pulse and to said delayed clock signal pulse for generating one of said plurality of combinative logic signals to "SET" said bistable circuit (FF2) substantially coincident in time with a transition of either of said delayed signal pulses; and said logic means (OR1, N1) further comprises a "NAND" gate (N1) connected to said delay means (DLY1, DLY2) and to said bistable circuit (FF2) and responsive to said delayed data signal pulse and to said delayed clock signal pulse for generating another of said plurality of combinative logic signals to "RESET" said bistable circuit (FF2) in the presence of both said delayed data signal pulse and said delayed clock signal pulse.

8. A phase locked loop circuit (100) in accordance with claim 2 characterized in that said second means (125) comprises a delay means (DLY1, DLY2) connected to said input terminal (101) and to said generating means (120, 130) and responsive to said one data signal pulse and to said corresponding clock signal pulse for generating a delayed data signal pulse and a delayed clock signal pulse, respectively; and said delay means (DLY1, DLY2) generates said delayed pulses delayed from said one data signal pulse and said corresponding clock signal pulse by a period of time equivalent to the time required to effect a linear symmetrical relationship between the direction and width in time of said error correction signal pulse and of said phase difference when said phase difference is greater than minus $\pi$ radians and less than $\pi$ radians with reference to said periodic clock signal pulses.

9. A phase locked loop circuit (100) in accordance with claim 8 characterized in that said predetermined delay period is substantially equal to one half of the period of said corresponding clock signal pulse.

10. A phase locked loop circuit (100) in accordance with claim 2 characterized in that said second means (125) comprises a bistable circuit (FF2) having an enable state and an inhibit state, and said circuit means (140) is connected to said bistable circuit (FF2) and is adapted to selectively generate positive and negative error correction pulses and is responsive to said first means (FF1) assuming said first stable state and said bistable circuit (FF2) assuming said enable state for generating said positive error correction pulse and responsive to said first means (FF1) assuming said second stable state and said bistable circuit (FF2) assuming said enable state for generating said negative error correction pulse.

11. A phase locked loop circuit (100) in accordance with claim 10 characterized in that said positive error correction pulse and said negative error correction pulse each have a pulse width in time substantially equal to the magnitude of phase difference between said one data signal pulse and said corresponding clock signal pulse.

12. A phase locked loop circuit (100) in accordance with claim 10 characterized in that said generating means (120, 130) is connected to said circuit means (140) and comprises filtering means (120) responsive to said positive error correction pulse for generating a first low frequency correction signal having an energy content proportional to the integral in time of said positive error correction pulse and responsive to said negative error correction pulse for generating a second low frequency correction signal having an energy content proportional to the integral in time of said negative correction pulse.

13. A phase locked loop circuit (100) in accordance with claim 12 characterized in that said generating means (120, 130) further comprises an oscillator means (130) connected to said filtering means (120) and to said output terminal (150), and responsive to said first low frequency correction signal for increasing the frequency of said clock signal pulses and responsive to said second low frequency correction signal for decreasing the frequency of said clock signal pulses.

14. In a phase locked loop circuit (100) having a phase detection means (110) and a variable frequency clock pulse generating means (120, 130), a method for generating periodic clock output signal pulses in phase coincidence with an incoming synchronous aperiodic data signal, comprising the steps of:

A. generating periodic clock output signal pulses and applying said clock output signal pulses to said phase detection means (110); and B. applying received synchronous aperiodically occurring data input signal pulses to said phase detection means (110);

characterized in that said method further comprises the steps of:

C. generating an error correction signal pulse upon occurrence of a phase difference between one of said data signal pulses and a corresponding clock signal pulse, wherein said error correction signal pulse is indicative of the magnitude and direction of said phase difference; and D. adjusting the phase of said clock signal pulses in the direction of phase coincidence whereby the adjustment continuously decreases the magnitude of said phase difference.

15. A method for generating periodic clock output signal pulses in phase coincidence with aperiodically occurring synchronous data input signal pulses in accordance with claim 14 characterized in that said method further comprises the steps of:

A. generating a directional phase signal when said one data signal pulse occurs prior in time to said corresponding clock signal pulse;

B. generating a phase correction enable signal in the presence of both said one data signal pulse and the occurrence of said phase difference;

C. generating a positive error correction pulse in the presence of both said directional phase signal and said phase correction enable signal wherein the pulse width in time of said positive error correction pulse is substantially equal to the magnitude of said phase difference;

D. applying said positive error correction pulse to said generating means (120, 130) and generating a low frequency correction signal having an energy content proportional to the integral in time of said positive error correction pulse; and E. increasing the frequency of subsequently generated clock signal pulses in response to said low frequency correction signal.

16. A method for generating periodic clock output signal pulses in phase coincidence with aperiodically occurring synchronous data input signal pulses in accordance with claim 14 characterized in that said method further comprises the steps of:

A. generating a directional phase signal when said corresponding clock signal pulse occurs prior in time to said one data signal pulse;

B. generating a phase correction enable signal in the presence of both said one data signal pulse and the occurrence of said phase difference;

C. generating a negative error correction pulse in the presence of both said directional phase signal and said phase correction enable signal wherein the pulse width in time of said negative error correction pulse is substantially equal to the magnitude of said phase difference;

D. applying said negative error correction pulse to said generating means (120, 130) and generating a low frequency correction signal having an energy content proportional to the integral in time of said negative error correction pulse; and E. decreasing the frequency of subsequently generated clock signal pulses in response to said low frequency correction signal.

17. A method for generating periodic clock output signal pulses in phase coincidence with aperiodically occurring synchronous data input signal pulses in accordance with claim 14
characterized in that
said method further comprises the steps of delaying said one data signal pulse and said corresponding clock signal pulse for a predetermined period of time wherein said predetermined period of time is causative for effecting a linear symmetrical relationship between the direction and width in time of said error correction pulse and of said phase difference when said phase difference is greater than minus $\pi$ radians with reference to said periodic clock output signal pulses.

18. A method for generating periodic clock output signal pulses in phase coincidence with aperiodically occurring synchronous data input signal pulses in accordance with claim 14
characterized in that
said method further comprises the steps of:

A. delaying said one data signal pulse and said corresponding clock signal pulse for a predetermined period of time and generating a delayed data signal pulse and a delayed clock signal pulse, respectively;

B. logically combining said delayed data signal pulse and said delayed clock signal pulse and generating a plurality of combinative logic signals;

C. generating a phase correction enable signal substantially coincident in time with a transition of either of said delayed signal pulses;

D. inhibiting said phase correction enable signal in the presence of both said delayed data signal pulse and said delayed clock signal pulse; and E. generating said error correction signal pulse in the presence of said phase correction enable signal.

19. A method for generating periodic clock output signal pulses in phase coincidence with aperiodically occurring synchronous data input signal pulses in accordance with claim 14
characterized in that
said method further comprises the steps of:

A. generating a high temperature impedance correction signal and applying said high impedance correction signal to said generating means (120, 130) when said one data signal pulse is substantially in phase coincidence with said corresponding clock signal pulse; and B. generating said error correction signal pulse with a direction and pulse width in time having a linear symmetrical relationship to said phase difference when the value of said phase difference is greater than minus $\pi$ radians and less than $\pi$ radians with reference to said periodic clock output signal pulses.

20. A method for generating periodic clock output signal pulses in phase coincidence with aperiodically occurring synchronous data input signal pulses in accordance with claim 19
characterized in that
said method further comprises the step of delaying said one data signal pulse and said corresponding clock signal pulse for a predetermined period of time substantially equal to one half of the period of said clock output signal pulses.

* * * * *